(12) United States Patent
Blankenagel

(10) Patent No.: US 6,508,584 B2
(45) Date of Patent: Jan. 21, 2003

(54) METHOD AND APPARATUS FOR TESTING A TEMPERATURE SENSOR

(75) Inventor: John A. Blankenagel, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/994,080

(22) Filed: Nov. 16, 2001

(65) Prior Publication Data

US 2002/0048309 A1 Apr. 25, 2002

Related U.S. Application Data

(63) Continuation of application No. 09/256,324, filed on Feb. 23, 1999, now abandoned.

(51) Int. Cl.[7] .................................................. G01K 15/00
(52) U.S. Cl. .......................... 374/1; 374/141; 320/150; 340/636
(58) Field of Search ........................... 374/1, 164, 183, 374/141, 142, 4, 5; 320/150, 134, 136, 154, DIG. 21; 702/63, 130, 132; 340/636; 429/62, 24; 219/209, 520, 521

(56) References Cited

U.S. PATENT DOCUMENTS

| | | | | |
|---|---|---|---|---|
| 4,709,202 A | * | 11/1987 | Koenck et al. ................ 320/43 |
| 4,819,249 A | * | 4/1989 | Ekstrom et al. ................ 374/1 |
| 5,230,074 A | * | 7/1993 | Canova, Jr. et al. .......... 702/63 |
| 5,245,269 A | * | 9/1993 | Tooley et al. .................. 320/35 |
| 5,281,955 A | * | 1/1994 | Reich et al. .................. 320/136 |
| 5,590,058 A | * | 12/1996 | Foreman et al. ............... 702/63 |
| 5,645,949 A | * | 7/1997 | Young .......................... 320/27 |
| 5,711,605 A | * | 1/1998 | Reher et al. ................. 374/141 |
| 5,767,659 A | * | 6/1998 | Farley .......................... 320/150 |
| 5,912,546 A | * | 6/1999 | Sakou et al. ................. 320/134 |
| 6,076,964 A | * | 6/2000 | Wu et al. ..................... 374/141 |

* cited by examiner

Primary Examiner—Christopher W. Fulton
Assistant Examiner—Stanley J. Pruchnic, Jr.
(74) Attorney, Agent, or Firm—Blakely, Sokoloff, Taylor & Zafman LLP

(57) ABSTRACT

In accordance with one embodiment of a method and apparatus for testing a temperature sensor, an apparatus includes at least one component that affects ambient temperature. The at least one component is positioned on a circuit board so that when a current is applied to the at least one component the temperature of a temperature sensor is affected, where the temperature sensor is attached to a battery in contact with the circuit board. The response of the temperature sensor further includes the capability to be measured by external equipment. In accordance with another embodiment of a method and apparatus for testing a temperature sensor, a method of testing a temperature sensor attached to a battery, the battery being in contact with a circuit board, is as follows. The response to a temperature sensor is measured. Current is applied to the at least one heating component with sufficient proximity of the temperature sensor to affect its temperature. The response of a temperature sensor is measured after the temperature of a temperature sensor has been affected.

21 Claims, 1 Drawing Sheet

METHOD AND APPARATUS FOR TESTING A TEMPERATURE SENSOR

This is a Continuation of U.S. patent application No. 09/256,324, filed Feb. 23$^{rd}$, 1999 now abandoned titled "Method and Apparatus for Testing a Temperature Sensor," by John A. Blankenagel assigned to the assignee of the present invention and herein incorporated by reference.

BACKGROUND

1. Field

The present invention is related to testing and, more particularly, to testing a temperature sensor.

2. Background Information

Circuit boards typically employ a battery or battery pack. Such circuit boards are well-known and perform a variety of uses or operations. Temperature sensors, such as, typically thermistors, are used in these battery packs, such as rechargeable battery packs, to determine charge state. Typically, charging a battery or cell will cause its temperature to increase. When the battery is fully charged, its temperature will rise more quickly. Charging circuitry may sense this "quick" temperature rise ($\Delta T/\Delta t$–delta Temperature/delta time) and stop the charging or reduce the charge rate. Typically these temperature sensors are an integral part of the battery pack and are bonded to the case of one of the cells or batteries in the pack.

Testing the temperature sensors while the battery or battery pack is in contact with a circuit board, although desirable, is difficult. A need, therefore, exists for a convenient method and apparatus for testing these temperature sensors.

SUMMARY

Briefly, in accordance with one embodiment of the invention, a circuit board includes: at least one heating component. The at least one heating component is positioned on the board so that when a current is applied to the at least one heating component, a temperature sensor attached to a battery in contact with the circuit board is heated by the at least one heating component.

Briefly, in accordance with another embodiment of the invention, a method of testing a temperature sensor attached to a battery, the battery being in contact with a circuit board, is as follows. The response of the temperature sensor is measured. Current is applied to at least one heating component within sufficiently proximity of the temperature sensor to affect its temperature. The response of the temperature sensor is measured after the temperature of the temperature sensor has been affected.

Briefly, in accordance with one more embodiment of the invention, a circuit board includes:at least one component that affects ambient temperature. The at least one component is positioned on the circuit board so that when a current is applied to the at least one component the temperature of a temperature sensor is affected, the temperature sensor being attached to a battery in contact with the circuit.

Briefly, in accordance with still another embodiment of the invention, a method of modifying the temperature of a temperature sensor attached at a battery, the battery being in contact with a circuit board, is as follows. Current is applied to at least one component that affects ambient temperature, the component being positioned on the circuit board so as to affect the temperature of the temperature sensor when current is applied.

Briefly, in accordance with another embodiment of the invention, an apparatus includes: at least one battery, at least one component that affects ambient temperature, and a temperature sensor. The at least one component and temperature sensor is attached to the battery and positioned so that when a current is applied to the at least one component the temperature of the temperature sensor is affected.

Briefly, in accordance with still another embodiment of the invention, an apparatus includes: at least one battery, at least one heating component, and a temperature sensor. The at least one heating component and temperature sensor is attached to the battery and positioned so that when a current is applied to the at least one heating component, the temperature sensor is heated.

Briefly, in accordance with yet another embodiment of the invention, a method of modifying the temperature of a temperature sensor attached at a battery is as follows. Current is applied to at least one component that affects ambient temperature, the component being positioned on the battery so as to affect the temperature of the temperature sensor when current is applied.

Briefly, in accordance with still yet another embodiment of the invention, a method of testing a temperature sensor attached to a battery is as follows. The response of the temperature sensor is measured. Current is applied to at least one heating component positioned on the battery within sufficiently close proximity of the temperature sensor to affect its temperature. The response of the temperature sensor is measured after the temperature of the temperature sensor has been affected.

BRIEF DESCRIPTION OF THE DRAWINGS

The subject matter regarded as the invention is particularly pointed out and distinctly claimed in the concluding portions of this specification. The invention, however, both as to organization and method of operation, together with objects, features, and advantages thereof, may best be understood by reference to the following detailed description, when read with the accompanying drawings in which:

DETAILED DESCRIPTION

Figure 1:
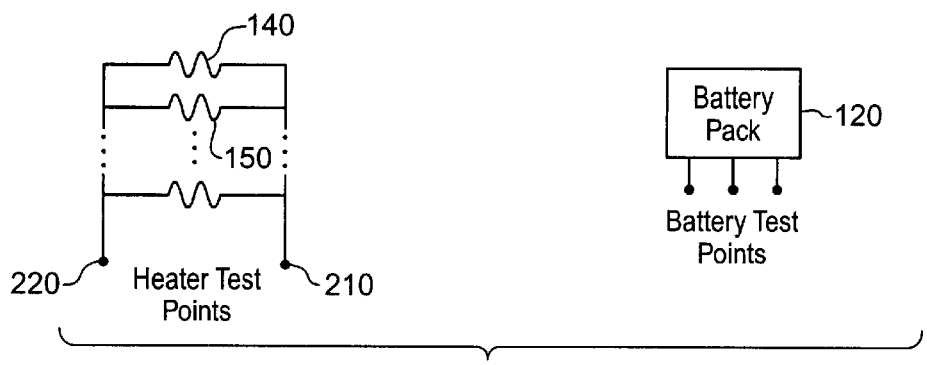
FIG. 1 is a schematic diagram illustrating test point connections for an embodiment in accordance with the present invention.

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

As previously indicated, temperature sensors, such as, typically thermistors, are used in battery packs, such as rechargeable battery packs, to determine charge state. Circuit boards typically employ these battery packs to provide power to the board's electronic circuitry. Although the invention is not limited in scope in this respect, these temperature sensors are generally an integral part of the battery pack and are bonded to the case of one of the cells or batteries in the pack. In this context, the term "battery" or "cell" refers to any self-contained unit or device that is capable of storing or stores electrical energy for relatively long periods and is capable of delivering it for use to a circuit or other application. Therefore, in this context, the terms "battery" and "cell" are used interchangeable, whereas the term "battery pack" refers to a group of cells or batteries.

As previously indicated, it is difficult to test these sensors, particularly while the battery or battery pack, that is portions thereof, is in direct physical contact with the board. Typically, automatic test equipment (ATE) is employed to test the operation of or at least parts of the circuit board. However, using standard ATE, in general, will not suffice because the electrical characteristics of the temperature sensor, such as resistance, voltage, etc., typically only change with changes in temperature.

As is well-known, automatic test equipment is used in production environments to verify that the correct passive parts or components, e.g. resistors, capacitors, are placed on the board and also to do rudimentary parametric and functional testing. The equipment typically applies a stimulus, e.g. voltage, current, or sequence of voltages or currents, and then measures a response or sequence of responses. With a battery pack that has a temperature measuring component, such as a thermistor, for example, the ATE may have the ability to measure the battery voltage; however, usually this is of limited usefulness without signals or information regarding what the battery voltage should be, such as if it has been charged to a known state. The equipment may also have the capability to measure the state of the temperature sensor, although, again, this is limited in usefulness unless there are signals or information to correlate the reading to the actual temperature of the sensor. As indicated previously, automatic test equipment is typically employed in connection with circuit boards, such as printed circuit boards, to test the functionality of the board prior to shipment. However, such equipment typically is not instrumented with heaters or coolers to test a device, such as a temperature sensor, such as those that may be used in connection with rechargeable battery packs, for example.

Figure 2A:
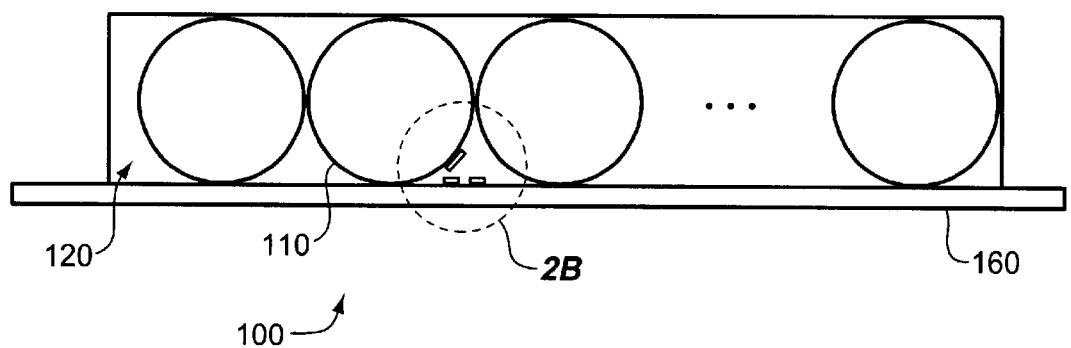
FIGS. 2A and 2B is are a side view perspective of an embodiment in accordance with the present invention.

FIG. 2A is a perspective diagram illustrating an embodiment 100 in accordance with the present invention. As the previous discussion indicates, one aspect of testing the temperature sensor includes having the capability to modify its temperature. Testing may then be accomplished by measuring the response of the sensor prior to modification and after modification. As shall be described in more detail hereinafter, in one embodiment of the invention, the temperature sensor value or response is measured, then the temperature is changed and the value or response is remeasured to verify that the response has changed and that, therefore, the temperature sensor is functional. The actual response values at the two measured temperatures is less critical since, as indicated previously, during charging, it is the change in value that is used to determine when to cease charging.

Figure 2B:
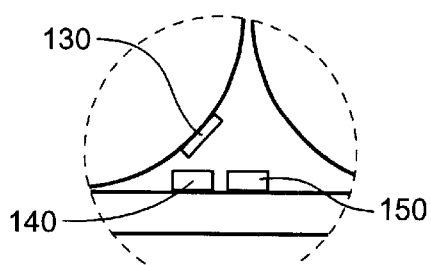

FIGS. 2A and 2B illustrate a circuit board 160 including components that affect ambient temperature, such as heating components 140 and 150. Of course, the invention is not restricted in scope to only heating components. For example, components that cool also affect ambient temperature. As shall be explained in more detail later, these particular heating components comprise heater resistors in this embodiment, although the invention again is not limited in scope in this respect. Furthermore, as illustrated in FIGS. 2A and 2B the heating components are positioned on the circuit board so that when a current is applied to the heating components, a temperature sensor, such as temperature sensor 130 in FIG. 2B, attached to a battery cell, such as cell 110 in FIG. 2A, is heated by the heating components due at least in part to the proximity of the temperature sensor to the heating components. Of course, in an alternative embodiment, as indicated above, for example, the temperature of the temperature sensor may be modified or affected in ways other than by being heated.

In this particular embodiment, cell 110 is part of a rechargeable battery pack 120, although the invention is not limited in scope in this respect. Furthermore, temperature sensor 130 in this particular embodiment includes a thermistor, although, again, the invention is not limited in scope in this respect. Any temperature sensor whose electrical characteristics change with the changes in temperature will suffice. Furthermore, the heating components need not include heater resistors and any components having a non-zero resistance may be employed as heating components, for example. Although the invention is not limited in scope to employing a rechargeable battery pack, this is a typical application in accordance with the present invention. Likewise, typically an embodiment will include a printed circuit board although, again, the invention is not limited in scope in this respect.

In the embodiment in which heater resistors are employed and mounted on the board, these resistors heat the temperature sensor, thus changing its electrical characteristics in a measurable way, such as resistance for a thermistor, in an embodiment in which, for example, a thermistor is employed. As illustrated in FIG. 1, in this particular embodiment, the heater resistors, such as 140 and 150, are connected or coupled to test points 210 and 220, that may be accessed by the automatic test equipment. FIG. 1 also illustrates that more than two heater resistors or other heating components may be employed in an embodiment. The automatic test equipment may, therefore, be programmed or constructed to supply a sufficient current to the resistors to cause them to heat up. Due to the proximity of the temperature sensor to the heater resistors, in this particular embodiment, the heat is radiated to the temperature sensor on the battery pack and the resultant sensor electrical characteristics change in a way that is measured by the automatic test equipment. Of course, in an alternative embodiment, where the temperature of the temperature sensor is affected, but not by heating, the components that result in affecting the temperature of the temperature sensor, such as those that affect ambient temperature, are positioned on the board to affect the temperature of the temperature sensor when current is applied, so that the response of the temperature sensor is likewise affected.

As illustrated in FIG. 1, one or more test points 180 are employed in this embodiment to couple the automatic test equipment to the temperature sensor. In one embodiment, a measurement of the response value of the sensor is taken before the temperature is affected and another measurement is taken after the temperature is affected to verify that the response value has changed. The invention is not limited in scope to the direction or amount of the change, although, of course, this information may be stored by the ATE and used in this particular embodiment. For instance, in one embodiment, the resistance of a negative temperature coefficient (NTC) thermistor will drop as temperature rises. Typically, for this particular embodiment, at the beginning of a test, the response value would be measured, then current would be applied to the heater resistors while other testing is done on the board by the ATE. This allows adequate time for the resistors to heat up sufficiently to change the temperature of the response value of the sensor is again measured. It may be convenient to arrange the testing performed by the ATE so that a measurement is taken before any other ATE testing is performed and another measurement is taken after all the other ATE testing is performed, although the invention is not limited in scope in this respect. Likewise, the invention is not limited in scope to taking only two measurements. The number of measurements and ordering of events, such as other ATE testing, will depend at least in part upon the particular circumstances, the particular equipment, and the particular circuit board.

Figure 3:
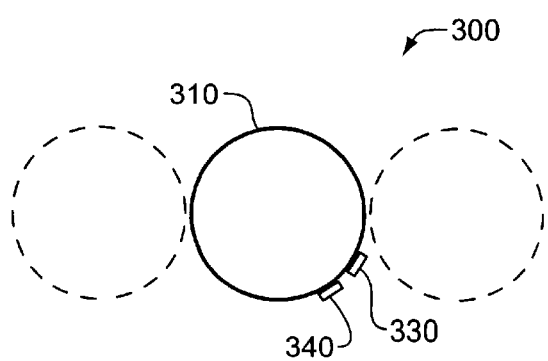
FIG. 3 is a side view of another embodiment in accordance with the present invention.

Another embodiment in accordance with the present invention is shown in FIG. 3. This embodiment 300 is similar to the previously described embodiment, although in this embodiment the battery or cell, such as 310, in not in direct contact with a circuit board. This may occur, for example, without intending to limit the scope of the invention in this respect, in a cell phone or similar device. Therefore, in the embodiment, the component that affects ambient temperature, such as, for example, a heating component, such as 340 in FIG. 3, is, instead, attached to battery or cell 310. In this embodiment, the component, such as a heating component, is attached to the battery within a sufficient proximity of the temperature sensor, such as 330 in FIG. 3, to affect the temperature when a current is applied to the component for a sufficient amount of time. In other respects, this embodiment operates in a manner similarly to the manner described for the previous embodiment. For example, as illustrated by dashed lines in the FIG., battery 310 may or may not be part of a battery pack and the other batteries may or may not include temperature sensors and heating components.

An embodiment of a method of modifying the temperature of a temperature sensor attached to a battery cell in contact with a circuit board, such as may be performed by the previously described embodiment shown in FIGS. 2A and 2B, is as follows. Current is applied to one or more components that affect ambient temperature, such as heating components, although the invention is not limited in scope in this respect. The components are positioned on the circuit board so as to affect the temperature of the temperature sensor when current is applied. Alternatively, an embodiment of a method of modifying the temperature of a temperature sensor attached to a battery, such as may be performed by the previously described embodiment shown in FIG. 3, is as follows. Current is applied to one or more components that affect ambient temperature, such as heating components, although the invention is not limited in scope in this respect. The components are positioned on the battery so as to affect the temperature of the temperature sensor when current is applied.

Another embodiment in accordance with the invention may alternatively comprise a method of testing a temperature sensor attached to a battery cell, the battery cell being in contact with a circuit board. In such an embodiment, the response of the temperature sensor is measured to get a baseline measurement. Then current is applied to one or more components that affect ambient temperature, such as heating components, within sufficient proximity of the temperature sensor for a sufficient period of time for the components to affect the temperature of the temperature sensor. The response of the temperature sensor is then again measured and the two measurements are compared, in this particular embodiment.

As previously described, the battery cell may be part of a battery pack, such as a rechargeable battery pack, although the invention is not limited in scope in this respect. Furthermore, typically, an embodiment in accordance with the invention will be practiced in conjunction with a printed circuit board, although again the invention is not limited in scope in this respect. A typical temperature sensor may comprise a thermistor, although, as previously indicated, any temperature sensor whose electrical characteristics change with temperature will suffice. Likewise, in this particular embodiment, the one or more heating components comprise one or more heater resistors. Furthermore, in this embodiment, the heater resistors are attached to the circuit board. As previously indicated, in this particular embodiment, the one or more heating components include test points and the temperature sensor also includes test points. Therefore, in this embodiment, the current is applied by the automatic test equipment which couples to the test points of the one or more heating components and the response of a temperature sensor is measured by the automatic test equipment that also couples to the test points of the temperature sensor.

Another embodiment in accordance with the invention may alternatively comprise a method of testing a temperature sensor attached to a battery or cell. In this embodiment, the component or components that affect ambient temperature, such as heating components, may also be attached to the battery or cell. In such an embodiment, the response of the temperature sensor is measured to get a baseline measurement. Then current is applied to the one or more components that affect ambient temperature, such as heating components, within sufficient proximity of the temperature sensor for a sufficient period of time for the components to affect the temperature of the temperature sensor. The response of the temperature sensor is then again measured and the two measurements are compared.

While certain features of the invention have been illustrated as described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. An apparatus comprising:
   a circuit board;
   at least one component positioned on the circuit board;
   a battery connected to the circuit board; and
   a temperature sensor, coupled to the battery, having at least one test point coupled to external test equipment, wherein a temperature response of the temperature sensor is measured by the external test equipment whenever a current is applied to the component.

2. An apparatus comprising:
   a circuit board;
   at least one heating component positioned on the circuit board;
   a battery connected to the circuit board; and
   a temperature sensor, coupled to the battery, having at least one test point coupled to external test equipment, wherein a temperature response of the temperature sensor is measured by the external test equipment whenever a current is applied to the heating component.

3. The apparatus of claim 2, wherein said circuit board comprises a printed circuit board.

4. The apparatus of claim 2, wherein said at least one heating component comprises a heater resistor.

5. The apparatus of claim 2, wherein said at least one heating component comprises a component having a non-zero resistance.

6. The apparatus of claim 2, wherein said temperature sensor comprises a thermistor.

7. The apparatus of claim 2, wherein the battery is part of a battery pack.

8. The apparatus of claim 7, wherein the battery pack comprises a rechargeable battery pack.

9. The apparatus of claim 8, wherein said temperature sensor is positioned on a battery in said battery pack so that when the battery pack is in contact with the circuit board said temperature sensor is within sufficiently close proximity of said at least one heating component so that heat radiated by said at least one heating component is incident on said temperature sensor.

10. The apparatus of claim 2, wherein said external test equipment comprises automatic test equipment (ATE), and wherein said temperature sensor includes test points capable of being coupled to said ATE.

11. The apparatus of claim 10, wherein said at least one heating component includes test points capable of being coupled to said ATE.

12. The apparatus of claim 2, wherein the response of said temperature sensor comprises a change in an electrical characteristic of said temperature sensor.

13. The apparatus of claim 12, wherein the electrical characteristic comprises the resistance of the temperature sensor.

14. The apparatus of claim 2, wherein said at least one heating component comprises a plurality of heating components.

15. A method comprising:

measuring the response of a temperature sensor attached to a battery in contact with a circuit board, the temperature sensor having at least one test point;

applying current from external test equipment to at least one heating component within sufficiently close proximity of the temperature sensor to heat the temperature sensor; and measuring a temperature response of the temperature sensor at the external test equipment after the temperature of the temperature sensor has been affected by the heating component.

16. The method of claim 15, wherein the battery is part of a battery pack.

17. The method of claim 15, wherein the circuit board comprises a printed circuit board.

18. The method of claim 15, wherein the temperature sensor comprises a thermistor.

19. The method of claim 15, wherein the at least one heating component comprises a heater resistor.

20. The method of claim 15, wherein the at least one heating component is attached to the circuit board.

21. The method of claim 20, wherein the at least one heating component has test points; and wherein the temperature sensor has test points.

* * * * *